United States Patent
Fu et al.

(10) Patent No.: US 8,749,002 B2
(45) Date of Patent: Jun. 10, 2014

(54) STRUCTURE AND METHOD FORM AIR CAVITY PACKAGING

(71) Applicant: WIN Semiconductors Corp., Tao Yuan Shien (TW)

(72) Inventors: Zi-Hong Fu, Tao Yuan Shien (TW); Sung-Mao Yang, Tao Yuan Shien (TW); Chun-Ting Chu, Tao Yuan Shien (TW); Wen-Ching Hsu, Tao Yuan Shien (TW)

(73) Assignee: Win Semiconductors Corp., Tao Yuan Shien (TW)

( * ) Notice: Subject to any disclaimer, the term of this patent is extended or adjusted under 35 U.S.C. 154(b) by 0 days.

(21) Appl. No.: 13/760,855

(22) Filed: Feb. 6, 2013

(65) Prior Publication Data

US 2014/0103518 A1 Apr. 17, 2014

(30) Foreign Application Priority Data

Oct. 15, 2012 (TW) .............................. 101137982 A

(51) Int. Cl.
*H01L 29/84* (2006.01)

(52) U.S. Cl.
USPC .................. 257/417; 257/734; 257/E21.499; 257/E21.502; 257/E23.141; 438/57; 438/62

(58) Field of Classification Search
USPC ............. 257/417, 734, E21.499–502, 23.141; 438/57–62, 109–113
See application file for complete search history.

(56) References Cited

U.S. PATENT DOCUMENTS

| | | | |
|---|---|---|---|
| 2005/0170546 A1* | 8/2005 | Patel et al. ...................... | 438/48 |
| 2008/0038873 A1* | 2/2008 | Tanida .......................... | 438/116 |
| 2009/0169035 A1* | 7/2009 | Rombach et al. ............. | 381/175 |
| 2010/0199777 A1* | 8/2010 | Hooper et al. .................. | 73/721 |
| 2011/0036174 A1* | 2/2011 | Hooper et al. .................. | 73/721 |
| 2011/0254150 A1* | 10/2011 | Takahashi et al. ............ | 257/734 |
| 2013/0093031 A1* | 4/2013 | Gao et al. ...................... | 257/417 |

* cited by examiner

*Primary Examiner* — Michael Lebentritt
(74) *Attorney, Agent, or Firm* — Muncy, Geissler, Olds & Lowe, P.C.

(57) ABSTRACT

A structure and method for air cavity packaging, the structure comprises a carrier having plural die pads and leads, plural dies, plural wires, plural walls, and a lid. The dies are mounted on the die pads. The wires electrically connect the dies to the leads. The plural walls are disposed on the carrier and form plural cavities in a way that each cavity contains at least one die pad and plural leads, and each wall is provided with at least one air vent for exhausting air to the outside. The lid is attached on the plural walls via an adhesive agent to seal the plural air cavities, so that the plural connected air cavity packages are formed.

15 Claims, 13 Drawing Sheets

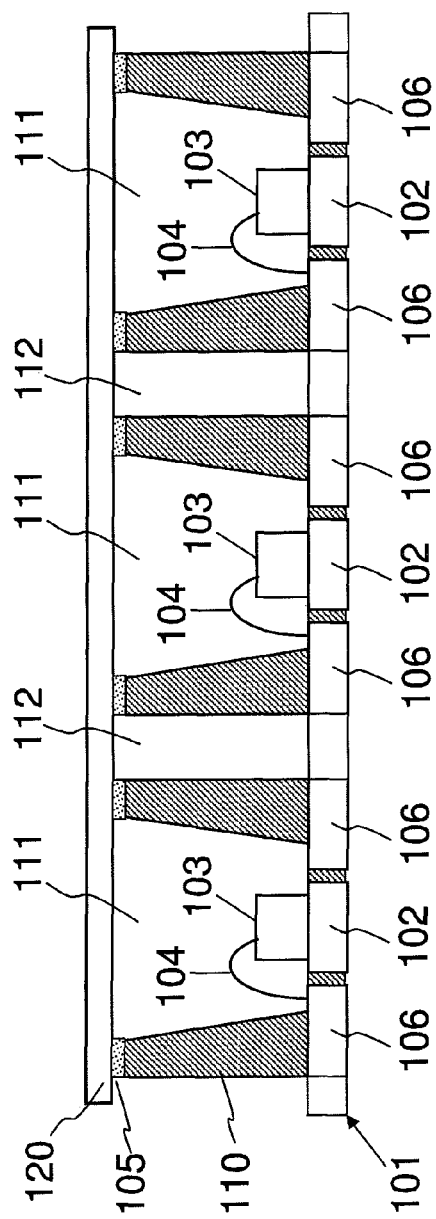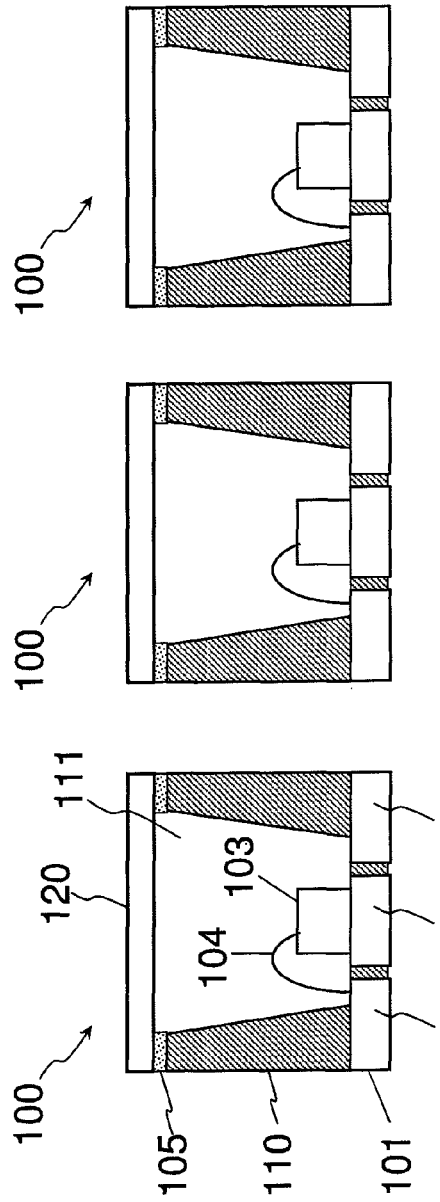
FIG. 1A
FIG. 1B

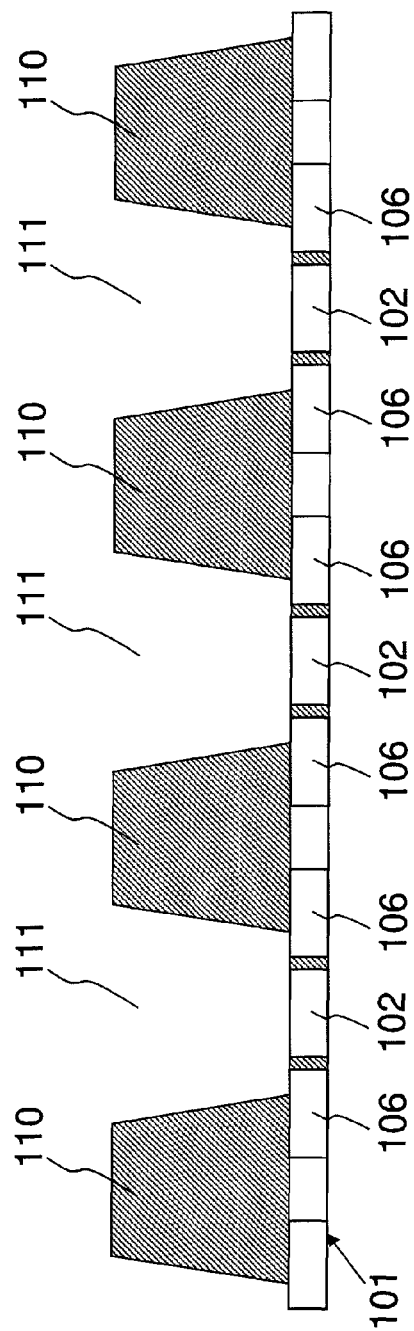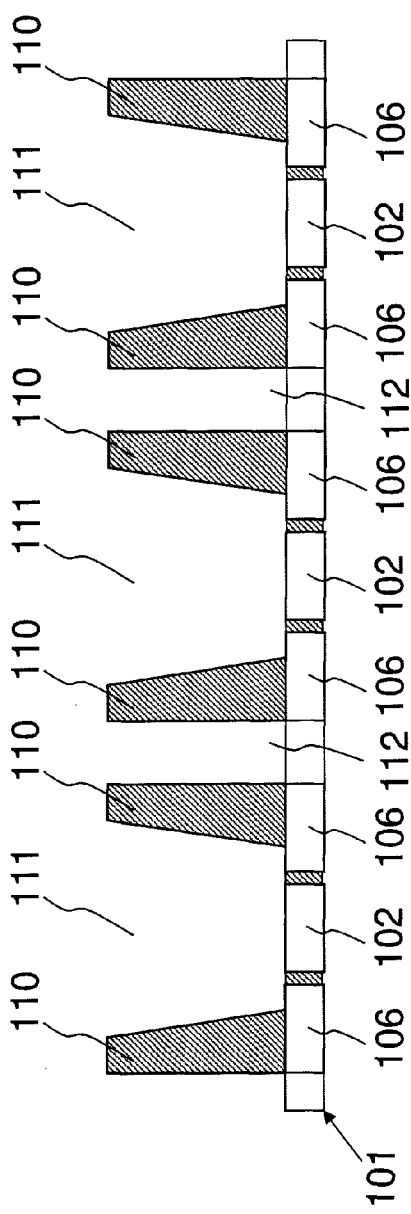

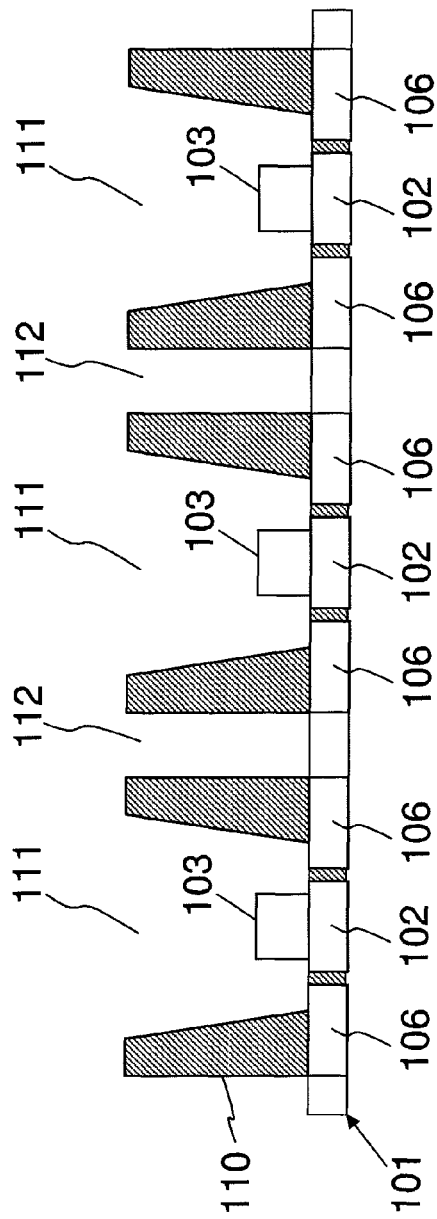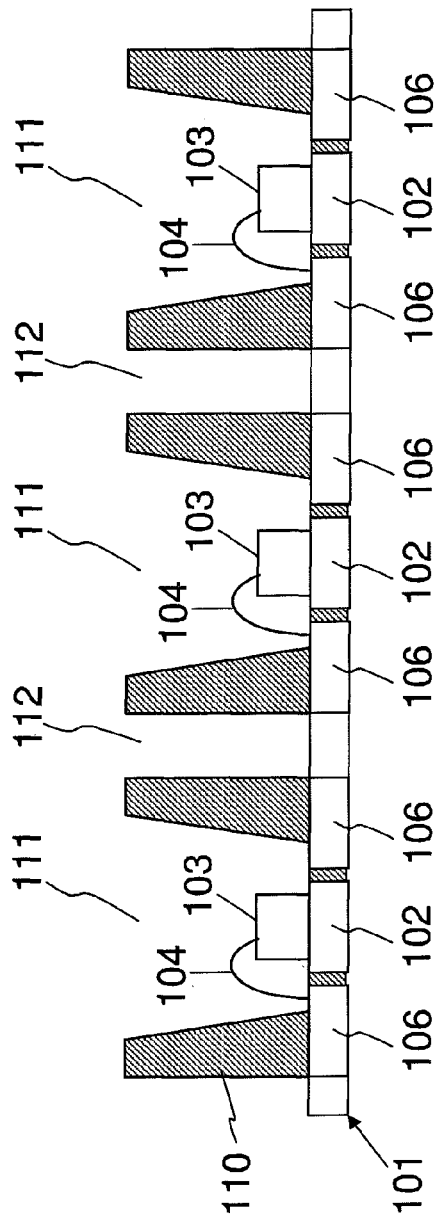

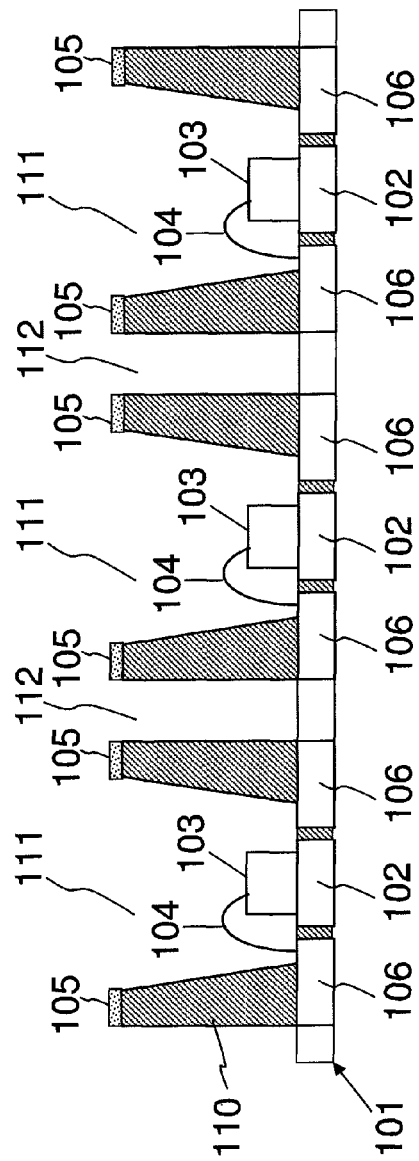
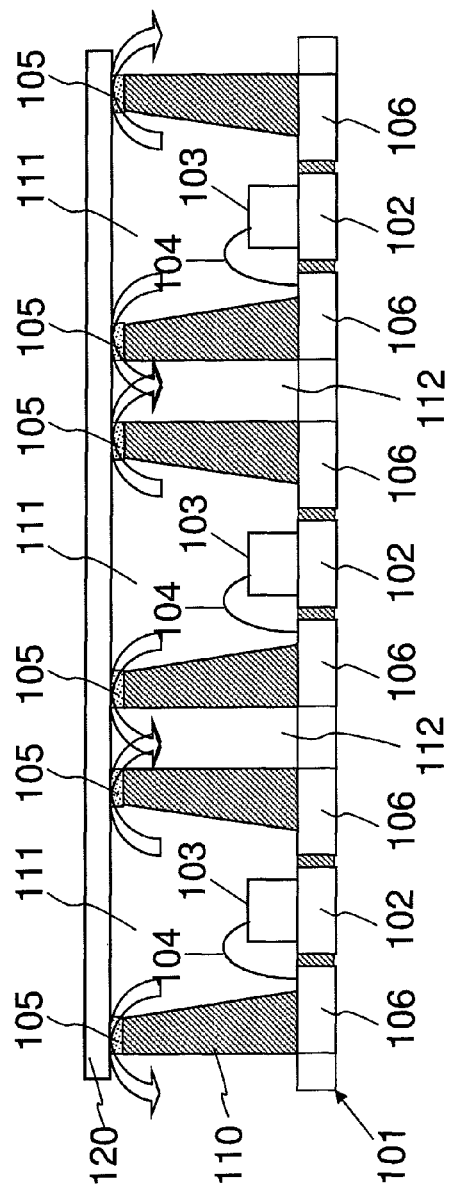
FIG. 3E
FIG. 3F

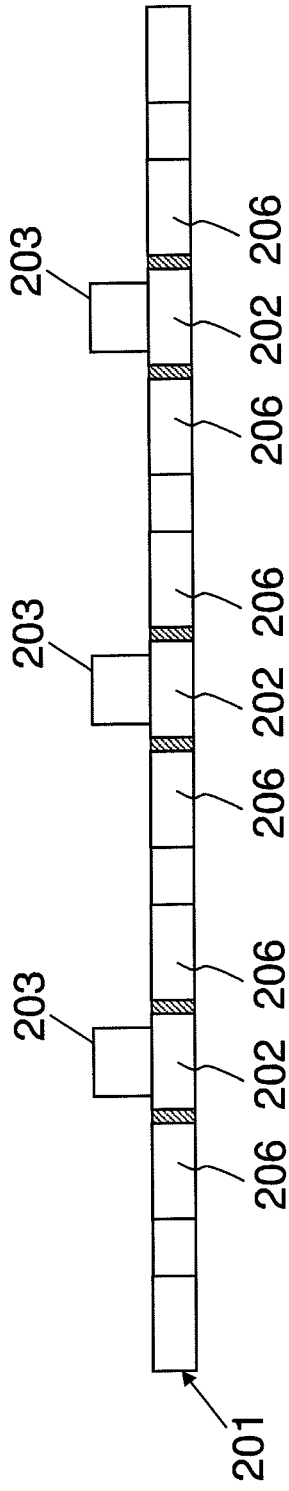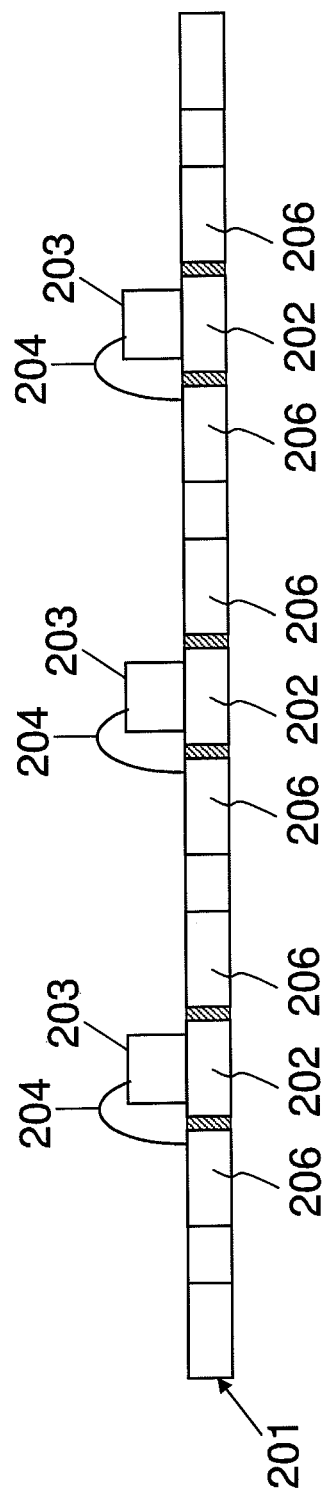
FIG. 5A
FIG. 5B

STRUCTURE AND METHOD FORM AIR CAVITY PACKAGING

FIELD OF THE INVENTION

The present invention relates to a structure and method for semiconductor dies packaging, and more particularly, to a structure and method for air cavity packaging used for high frequency or high power semiconductor devices.

BACKGROUND OF THE INVENTION

After the fabrication of semiconductor dies, a packaging process is required to provide the dies support and to protect them against the moisture corrosion or any other damage. A conventional semiconductor dies packaging process includes die bonding, then wire bonding, and finally used molding compound to seal the package, so that the circuits on the dies can be protected against the moisture corrosion. For high frequency devices, however, the conventional packaging method may suppress high frequency performance of the devices. In the air cavity packaging method, a sealed cavity is formed around the dies in the package. The medium in the package is gas (e.g., vacuum, nitrogen, air), which can provide good insulation and the power consumption can thus be reduced. The air cavity packaging method is especially applicable to high frequency and high power devices such as RF system, microwave system, MEMS, MOEMS and photo-sensing devices (e.g., CCD, CMOS).

In the conventional air cavity packaging, however, while curing the adhesive agent by heating, voids occur frequently in the adhesive agent owing to the air in the air cavity exhausting to the outside. If plural connected packages are produced at once, the adhesive agent will overflow to the adjacent packages due to the release of the air pressure from the air cavities, which leads to degradation of the performance of the dies. Therefore, in the conventional air cavity packaging, usually only one package is produced at one time to prevent the problem of voids and adhesive agent overflow, which limits the yield of packages.

SUMMARY OF THE INVENTION

The main object of the present invention is to provide a structure for air cavity packaging, in which air vents are disposed in a package structure including plural connected air cavity packages, so that the air in the air cavities can be exhausted to outside through the air vents while curing the adhesive agent. The occurrence of voids can thus be reduced. Moreover, plural packages can be produced at once, and both the packaging quality and yield can be improved.

To reach the objects stated above, the present invention provides a structure for air cavity packaging, which comprises a carrier, plural dies, plural wires, plural walls, and a lid. The carrier comprises plural die pads and plural leads. Each of the plural dies is mounted on a die pad. The plural wires electrically connect the plural dies to the plural leads. The plural walls are disposed on the carrier and form plural cavities in a way that each cavity contains at least one die pad and plural leads, and each wall is provided with at least one air vent for exhausting air to the outside. The lid is attached on the plural walls by means of an adhesive agent, so that the plural cavities are sealed to plural sealed cavities. While curing the adhesive agent applied between the lid and the walls, the air in the air cavities can be exhausted to outside through the air vents. The air cavity package structure is then diced into plural air cavity packages.

The present invention provides another structure for air cavity packaging, which comprises a carrier, plural dies, plural wires, and a lid. The carrier comprises plural die pads and plural leads. Each of the plural dies is mounted on a die pad. The plural wires electrically connect the plural dies to the plural leads. The lid has plural cavities on the underside thereof, in which at least one air vent for exhausting air to the outside is provided between every two adjacent cavities. The lid is attached on the carrier in a way that each cavity covers at least one die pad and plural leads, and the lid is sealed to the carrier to form plural sealed air cavities by means of an adhesive agent. While curing the adhesive agent applied between the lid and the carrier, the air in the air cavities can be exhausted to outside through the air vents. The air cavity package structure is then diced into plural air cavity packages.

Furthermore, the present invention provides a method for air cavity packaging, which comprises the following steps:

A1. providing a carrier comprising plural die pads and plural leads;

A2. disposing plural walls on the carrier and forming plural cavities in a way that each cavity contains at least one die pad and plural leads, and each wall provided with at least one air vent for exhausting air to the outside;

A3. providing plural dies, each mounted on a die pad;

A4. providing plural wires electrically connecting the plural dies to the plural leads;

A5. providing a lid, applying an adhesive agent to the top of the plural walls or the underside of the lid, covering the lid onto the plural walls, and curing the adhesive agent to attach the lid on top of the plural walls so that the plural cavities are sealed and an air cavity package structure having plural sealed air cavities are formed; and A6. dicing the air cavity package structure having plural sealed air cavities into plural air cavity packages.

The present invention provides another method for air cavity packaging, which comprises the following steps:

B1. providing a carrier comprising plural die pads and plural leads, and providing plural dies, each mounted on a die pad;

B2. providing plural wires electrically connecting the plural dies to the plural leads;

B3. providing a lid having plural cavities on the underside thereof, and providing at least one air vent for exhausting air to the outside between every two adjacent cavities;

B4. applying an adhesive agent to the top of the carrier or the underside of the lid, covering the lid onto the carrier in a way that each of the cavities covers at least one die pad and plural leads, and curing the adhesive agent to attach the lid on the carrier so that the plural cavities are sealed and an air cavity package structure having plural sealed air cavities are formed; and B5. dicing the air cavity package structure having plural sealed air cavities into plural air cavity packages.

In implementation, the carrier is made of metal or ceramic materials.

In implementation, the adhesive agent is epoxy, UV glue, or tin-gold.

In implementation, the plural walls are made of polymers, metal, or ceramic materials.

In implementation, the lid is made of polymers, metal, glasses, or ceramic materials.

In implementation, the adhesive agent is cured by heating.

The present invention will be understood more fully by reference to the detailed description of the drawings and the preferred embodiments below.

BRIEF DESCRIPTION OF DRAWINGS

FIGS. 1A and 1B are schematics showing a cross-sectional view of an embodiment of a structure for air cavity packaging according to the present invention.

FIG. 3A-3G are schematics showing the steps of a method for air cavity packaging according to the present invention.

FIG. 5A-5F are schematics showing the steps of another method for air cavity packaging according to the present invention.

DETAILED DESCRIPTIONS OF PREFERRED EMBODIMENTS

Figure 2A:
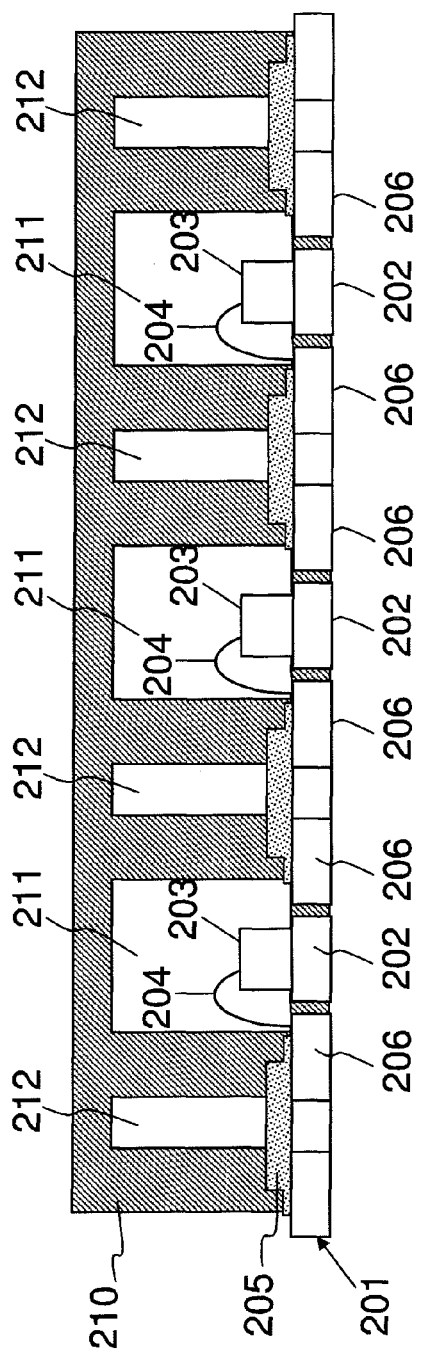
FIGS. 2A and 2B are schematics showing a cross-sectional view of another embodiment of a structure for air cavity packaging according to the present invention.

FIG. 1A is a schematic showing a cross-sectional view of an embodiment of a structure for air cavity packaging according to the present invention, which comprises a carrier 101, plural dies 103, plural wires 104, plural walls 110, and a lid 120. The carrier 101 comprises plural die pads 102 and plural leads 106. Each of the plural dies 103 is mounted on a die pad 102. The plural wires 104 electrically connect the plural dies 103 to the plural leads 106. The plural walls 110 are disposed on the carrier 101 and form plural cavities 111 in a way that each cavity 111 contains at least one die pad 102 and plural leads 106, and each wall 110 is provided with at least one air vent 112 for exhausting air to the outside. The lid 120 is attached on the plural walls 110 by means of an adhesive agent 105, so that the plural cavities 111 are sealed to plural sealed cavities. By dicing the package structure shown in FIG. 1A, plural air cavity packages 100 as shown in FIG. 1B can be produced.

Figure 4:
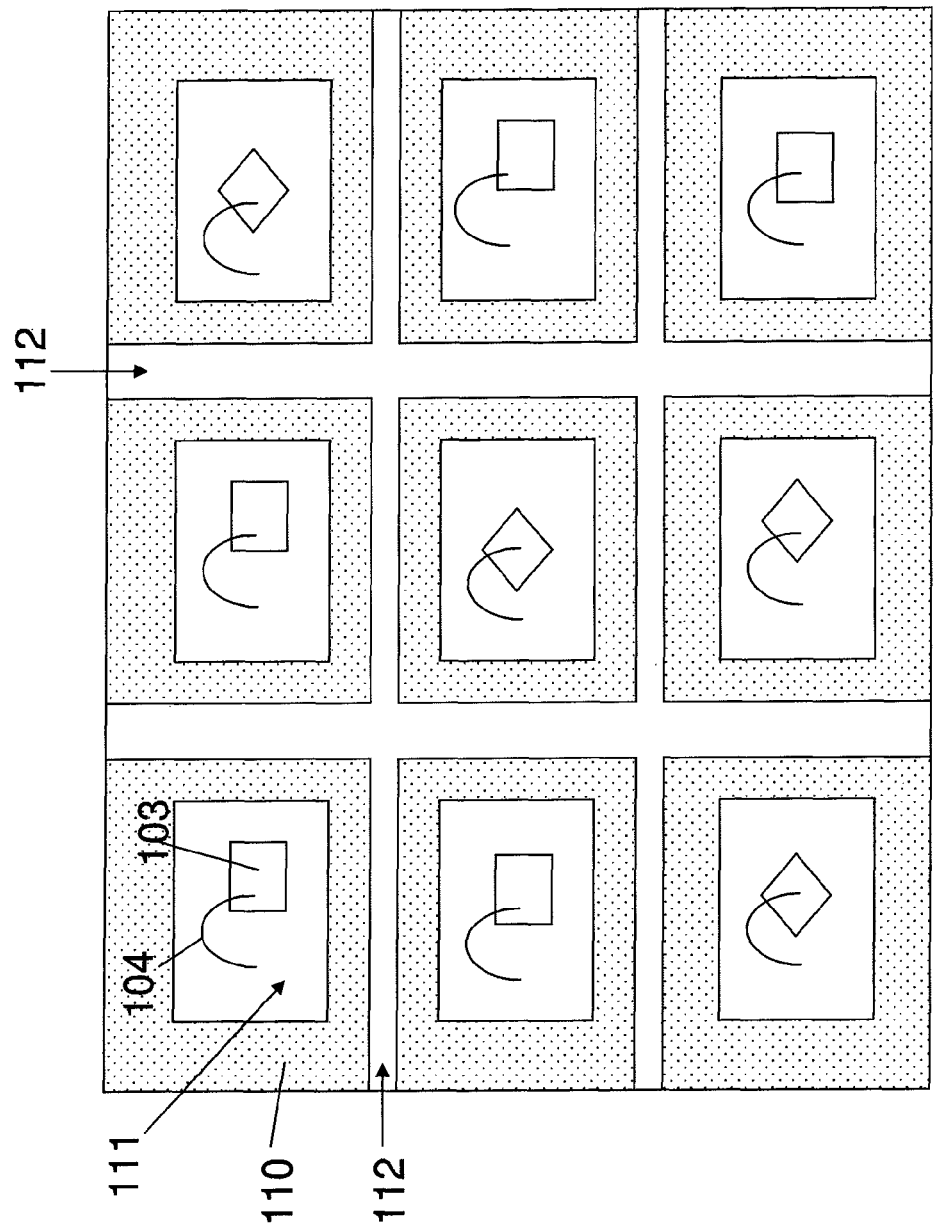
FIG. 4 is a schematic showing a top view of an embodiment of a structure for air cavity packaging according to the present invention.
Figure 5C:
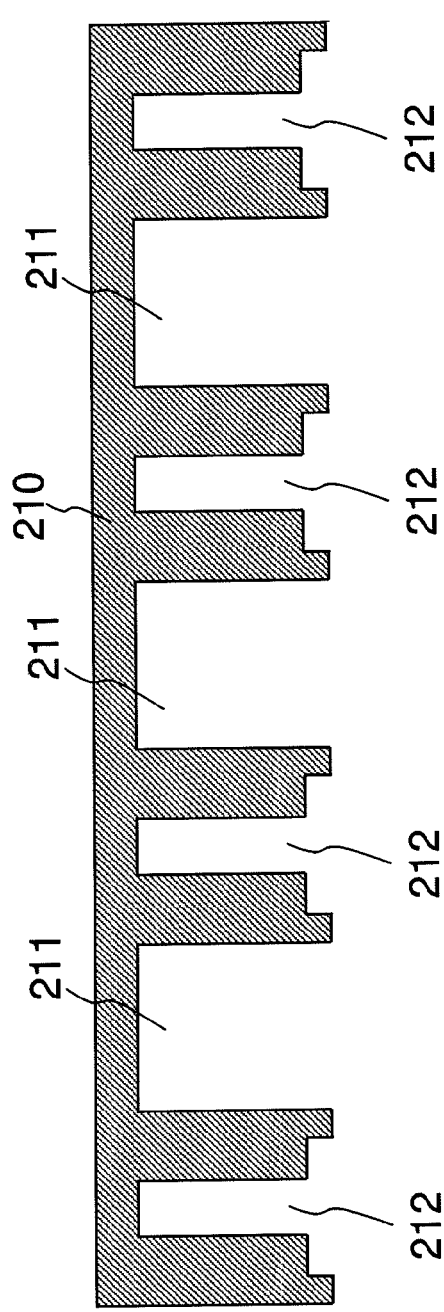
Figure 5D:
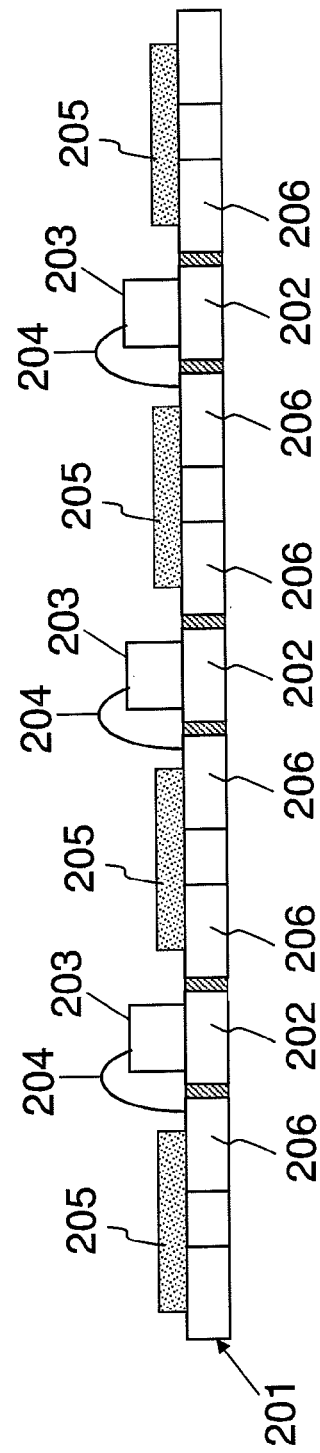
Figure 5E:
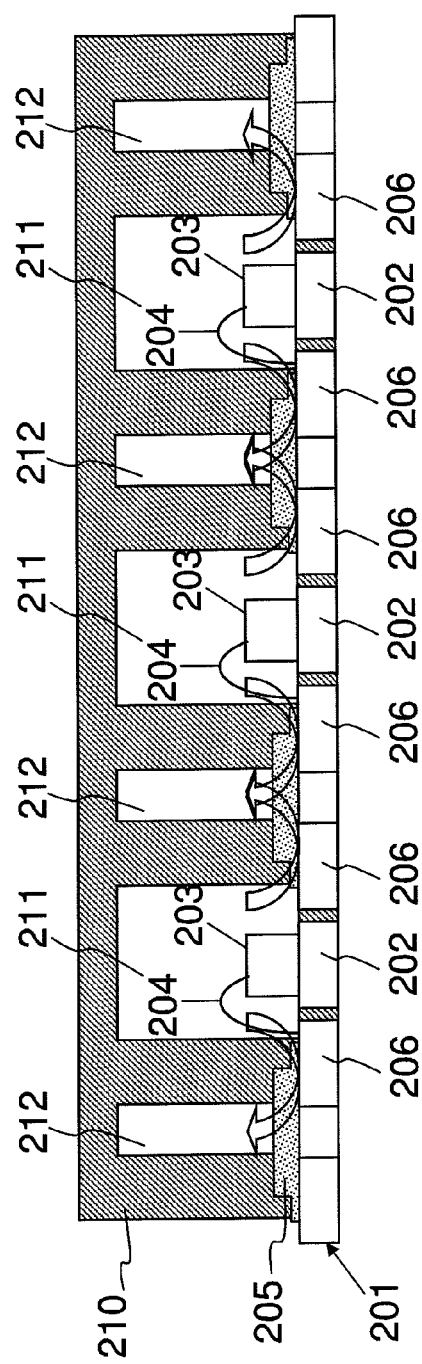
Figure 5F:
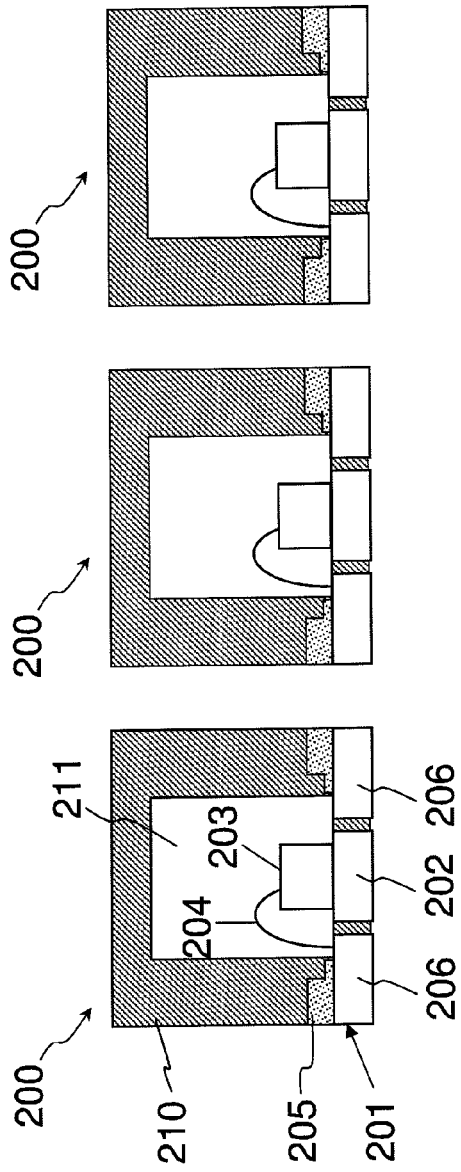

In implementation, the carrier 101 in the aforementioned embodiment can have a lead-frame base, a substrate base, or a ceramic base. The lead-frame base can be made of metallic materials, such as Cu alloy, Ni alloy, Pd alloy, or Au alloy. The substrate base can be made of various materials, such as Cu, Au, epoxy, solder mask. The ceramic base can be made of ceramic material, such as $Al_2O_3$, AlN, or BeO. The dies 103 are semiconductor dies, preferably compound semiconductor dies. The dies 103 can be mounted on the die pads 102 by using adhesive materials, such as silver glue. Each of the plural die pads can carry one or more than one dies. Wires 104 are made of materials with good electrical conductivity, such as Au or a metal containing Au. Walls 110 can be formed in a needed conformation according to the alignment of the die pads and the design of the packages. Each of the air vents 112 provided on the walls can have one end or multiple ends open to the outside or connect to other air vents that have open ends. FIG. 4 is a schematic showing a top view of the walls in an embodiment of the present invention. In this embodiment, the die pads are aligned in an array. The walls 110 are reticulated on the carrier and formed cavities 111 aligned in an array. Each of the cavities contains at least one die pad and plural leads. Each die 103 is mounted on a die pad 102 and is electrically connected to the leads 106 by wires 104. The air vents 112 on the walls are connected in a reticular form. By covering and sealing the lid 120 on top of the walls using adhesive agent, an array of plural connected packages is formed. For 2 mm×2 mm packages, for instance, about 2000 packages can be produced in one packaging run. The adhesive agent for sealing the walls 110 and the lid 120 may be a thermosetting adhesive material, such as epoxy, UV glue, or tin-gold. The walls 110 can be made of polymer such as liquid crystal polymer (LCP), plastic, ceramic materials, or metals. The lid 120 can be made of polymer such as liquid crystal polymer (LCP), plastic, ceramic materials, glasses, or metals.

Figure 2B:
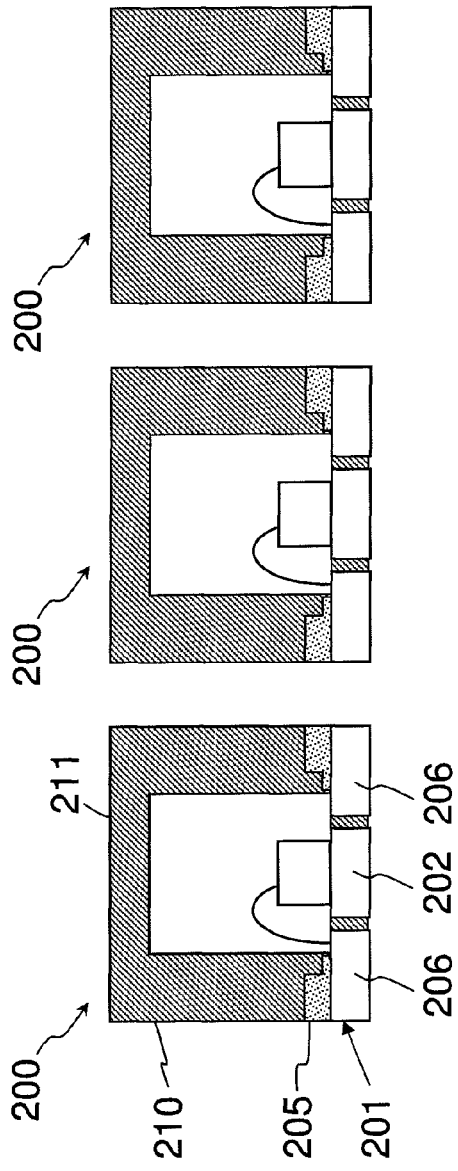
Figure 3G:
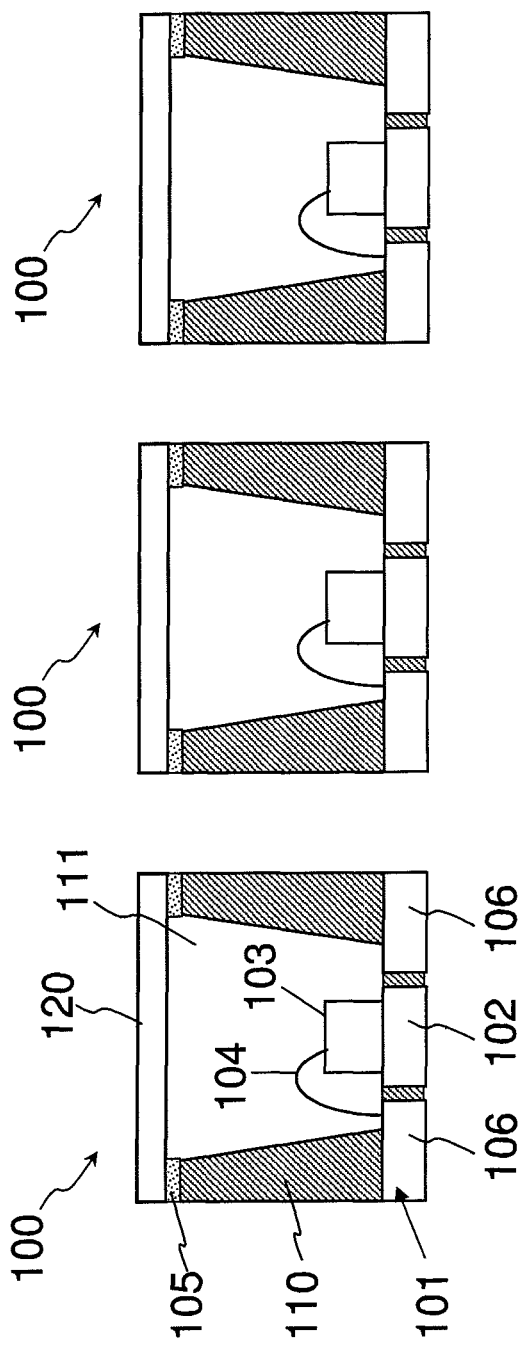

FIG. 2A is a schematic showing a cross-sectional view of another embodiment of a structure for air cavity packaging according to the present invention, which comprises a carrier 201, plural dies 203, plural wires 204, and a lid 210. The carrier 201 comprises plural die pads 202 and plural leads 206. Each of the plural dies 203 is mounted on a die pad 202. The plural wires 204 electrically connect the plural dies 203 to the plural leads 206. The lid 210 has plural cavities 211 on the underside thereof, in which at least one air vent 212 for exhausting air to the outside is provided between every two adjacent cavities. The lid 210 is attached on the carrier 201 in a way that each cavity covers at least one die pad 202 and plural leads 206, and the lid 210 is sealed to the carrier 201 by means of an adhesive agent 205 so that the plural cavities are sealed to plural sealed air cavities. By dicing the package structure shown in FIG. 2A, plural air cavity packages 200 as shown in FIG. 2B can be produced.

Figure 6:
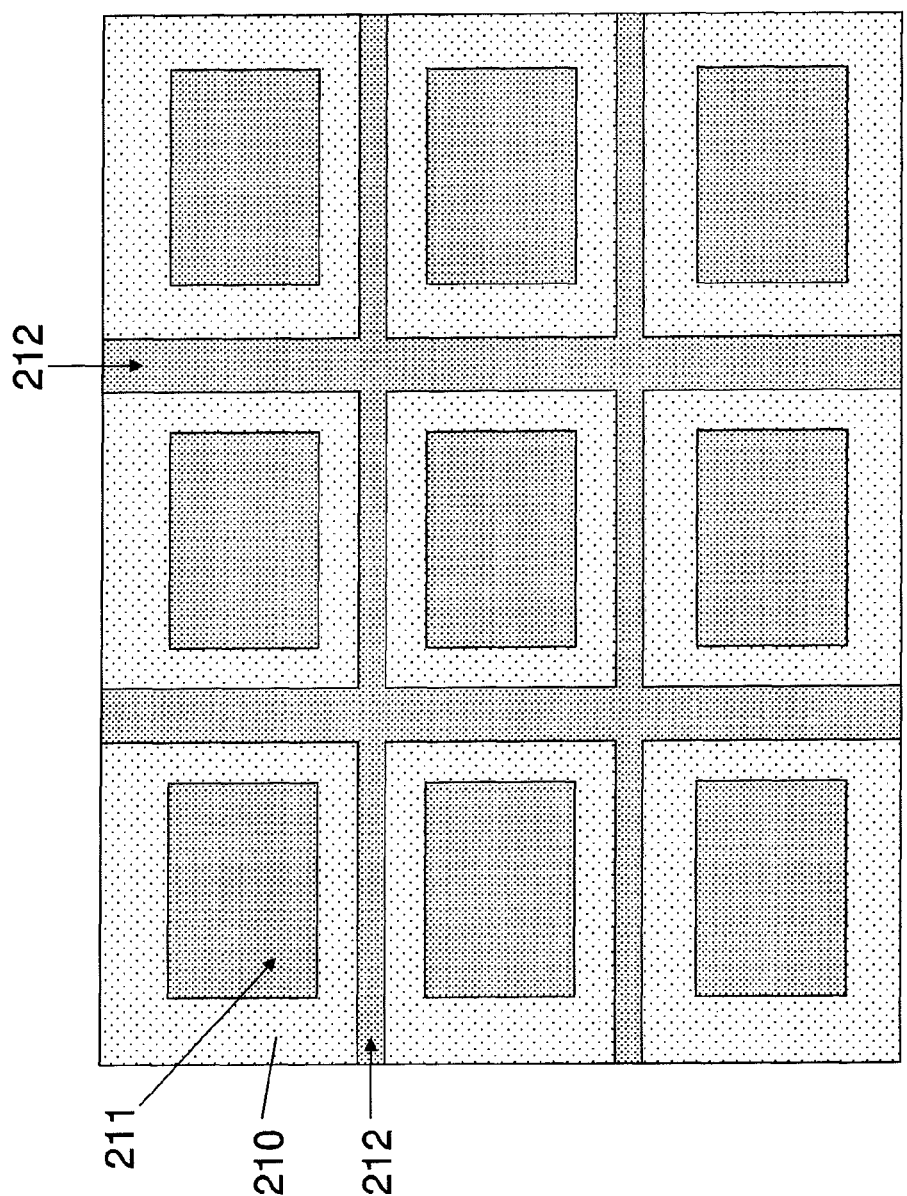
FIG. 6 is a schematic showing a bottom view of an embodiment of the lid of a structure for air cavity packaging according to the present invention.
Figure 7:
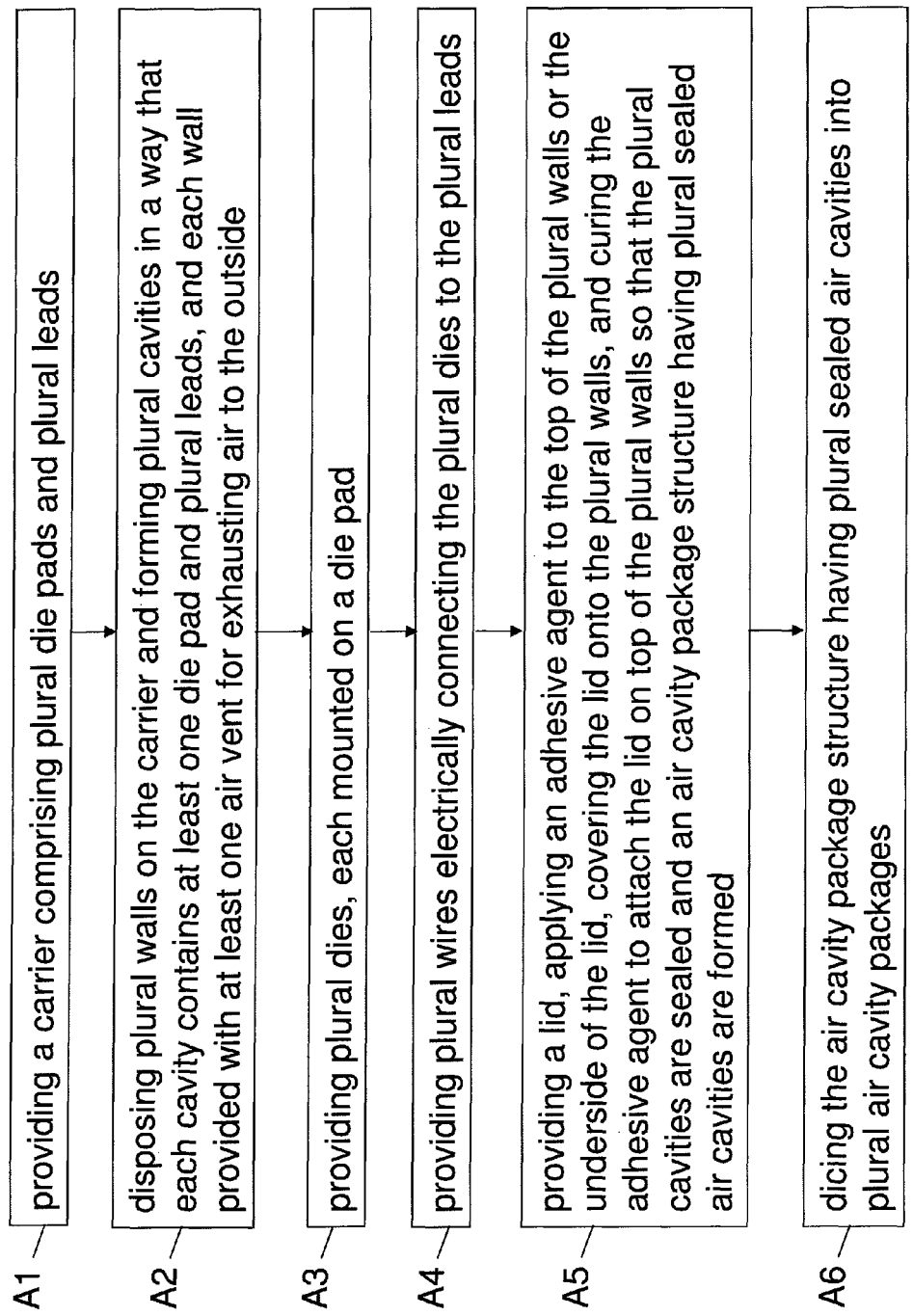
FIG. 7 is a flow chart of an embodiment of a method for air cavity packaging according to the present invention.
Figure 8:
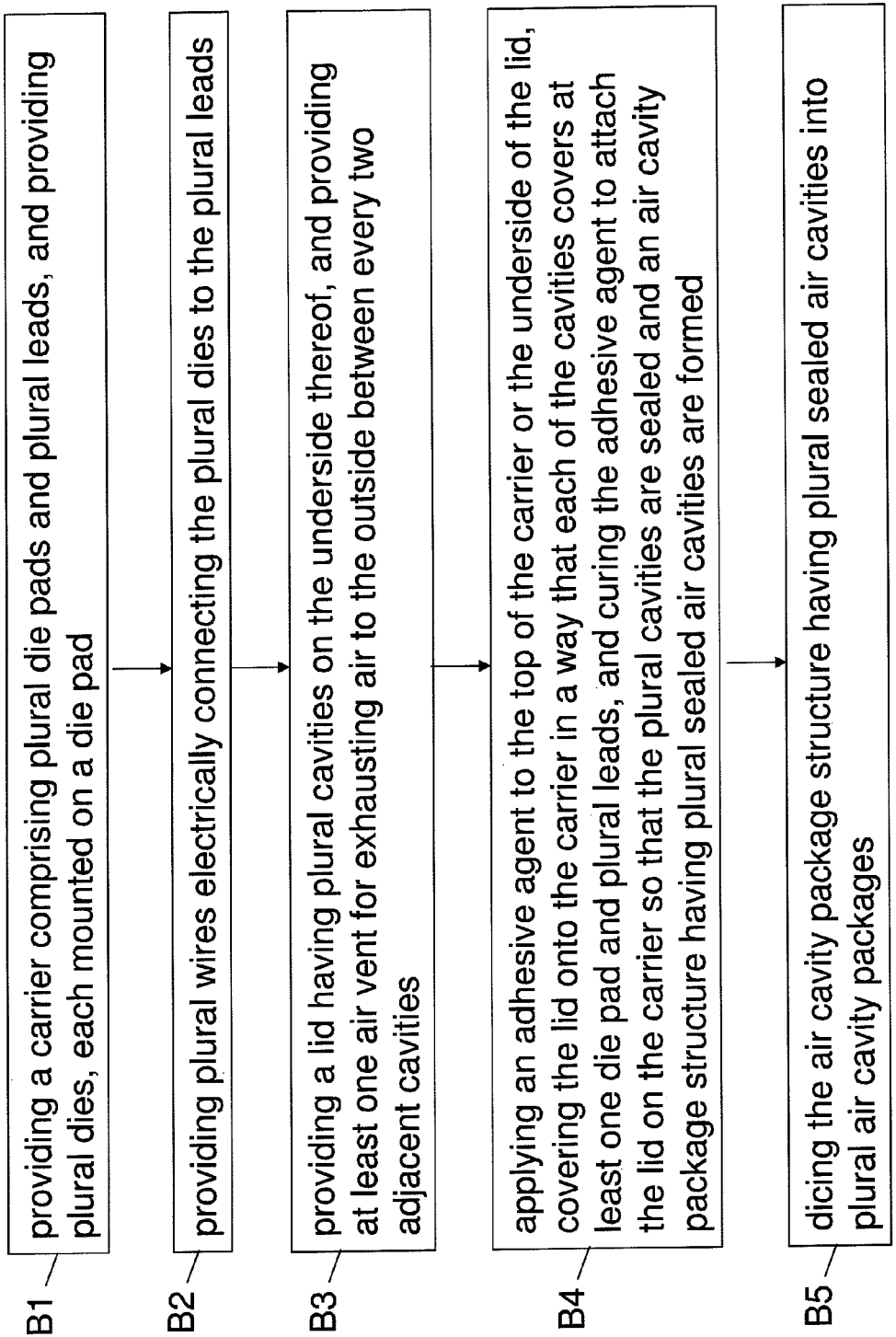
FIG. 8 is a flow chart of another embodiment of a method for air cavity packaging according to the present invention.

In implementation, the carrier 201 in the aforementioned embodiment can have a lead-frame base, a substrate base, or a ceramic base. The lead-frame base can be made of metallic materials, such as Cu alloy, Ni alloy, Pd alloy, or Au alloy. The substrate base can be made of various materials, such as Cu, Au, epoxy, solder mask. The ceramic base can be made of ceramic material, such as $Al_2O_3$, AlN, or BeO. The dies 203 are semiconductor dies, preferably compound semiconductor dies. The dies 203 can be mounted on the die pads 202 by using adhesive materials, such as silver glue. Each of the plural die pads can carry one or more than one dies. Wires 104 are made of materials with good electrical conductivity, such as Au or a metal containing Au. Forming plural walls 110 on the carrier 101 in the previous embodiment is replaced by using a one-piece lid 210 in this embodiment. The lid 210 can be formed in a needed conformation according to the alignment of the die pads and the design of the packages. Each of the air vents 212 provided to the lid can have one end or multiple ends open to the outside or connect to other air vents that have open ends. FIG. 6 is a schematic showing a bottom view of the lid in an embodiment of the present invention. In this embodiment, the die pads are aligned in an array. The cavities 211 formed by lid 210 are aligned in an array as well. The air vents 212 provided between adjacent cavities are connected in a reticular form. The adhesive agent 205 can be applied to the underside of the lid or the top of the carrier. By covering the lid 210 onto the carrier 201 and curing the adhesive agent 205, an array of plural connected air cavity packages is formed. For 2 mm×2 mm packages, for instance, about 2000 packages can be produced in one packaging run. The adhesive agent for sealing the lid 210 and the carrier 201 may be a thermosetting adhesive material, such as epoxy, UV glue, or tin-gold. The lid 210 can be made of polymer such as liquid crystal polymer (LCP), plastic, ceramic materials, glasses, or metal.

FIG. 3A-3G are schematics showing the following steps of a method for air cavity packaging according to the present invention:

A1. providing a carrier 101 comprising plural die pads 102 and plural leads 106;

A2. disposing plural walls 110 on the carrier 101 and forming plural cavities 111 in a way that each cavity contains at least one die pad 102 and plural leads 106, and each wall 110 provided with at least one air vent 112 for exhausting air to the outside;

A3. providing plural dies 103, each mounted on a die pad 102;

A4. providing plural wires 104 for electrically connecting the plural dies 103 to the plural leads 106;

A5. providing a lid 120, applying an adhesive agent 105 to the top of the plural walls 120 or the underside of the lid 120, covering the lid 120 onto the plural walls 110, and curing the adhesive agent 105 to attach the lid 120 on top of the plural walls 110 so that the plural cavities 111 are sealed and an air cavity package structure having plural sealed air cavities are formed; and A6. dicing the air cavity package structure having plural sealed air cavities into plural air cavity packages 100.

In implementation, the aforementioned air vents 112 provided on the walls 110 can be formed by cutting the walls after their formation, as shown in FIGS. 3A and 3B, or by directly forming walls 110 with air vents 112 on the carrier 110. The adhesive agent 105 may be a thermosetting adhesive material, such as epoxy, UV glue, or tin-gold. The adhesive agent can be applied to the underside of the lid or the top of the walls. By covering the lid 120 onto the plural walls 110 and curing the adhesive agent 105 by heating, the lid 120 is attached on the plural walls 110. In this step, the air pressure inside the cavities due to the pressure difference between the inside and outside of the cavities 111 caused by heating must be released, which induces overflow of the adhesive agent 105 applied between the lid 120 and the walls 110, as shown by the arrows in FIG. 3F. In the package structure provided by the present invention, the adhesive agent can overflow to the air vents 112 on the walls 110, and the excess air in the cavities can also be exhausted to the air vents 112 without damaging the structure of adjacent packages.

FIG. 5A~5F are schematics showing the following steps of another method for air cavity packaging according to the present invention:

B1. providing a carrier 201 comprising plural die pads 202 and plural leads 206, and providing plural dies 203, each mounted on a die pad 202;

B2. providing plural wires 204 for electrically connecting the plural dies 203 to the plural leads 206;

B3. providing a lid 210 having plural cavities 211 on the underside thereof, and providing at least one air vent 211 for exhausting air to the outside between every two adjacent cavities;

B4. applying an adhesive agent to the top of the carrier 201 or the underside of the lid 210, covering the lid 210 onto the carrier 201 in a way that each of the cavities 211 covers at least one die pad 202 and plural leads 206, and curing the adhesive agent 205 to attach the lid 210 on the carrier 201 so that the plural cavities 211 are sealed and an air cavity package structure having plural sealed air cavities are formed; and B5. dicing the air cavity package structure having plural sealed air cavities into plural air cavity packages 200.

In implementation, the aforementioned air vents 212 provided to the lid 210 can be formed by cutting the lid after its formation, or formed by directly molding a lid 210 with air vents 212. The adhesive agent 205 may be a thermosetting adhesive material, such as epoxy, UV glue, or tin-gold. The adhesive agent can be applied to the underside of the lid or the top of the carrier. By covering the lid 210 onto the carrier 201 and curing the adhesive agent 205 by heating, the lid 210 is attached on the carrier 201. In this step, the air pressure inside the cavities due to the pressure difference between the inside and outside of the cavities 211 caused by heating must be released, which induces overflow of the adhesive agent 205 applied between the lid 210 and the carrier 201, as shown by the arrows in FIG. 5E. In the package structure provided by the present invention, the adhesive agent can overflow to the air vents 212 in the lid 210, and the excess air in the cavities can also be exhausted to the air vents 212 without damaging the structure of adjacent packages.

The present invention has the following advantages:

1. The structures and methods for air cavity packaging provided by the present invention can fabricate a great number of air cavity packages on a carrier in one packaging run, thereby increasing the production rate of the air cavity packages.

2. The structures and methods for air cavity packaging provided by the present invention can be applied to air cavity packages of various sizes, types, and materials, as long as air vents open to the outside are disposed in the plural connected air cavity packages. The air pressure inside the air cavities can be exhausted to the outside through the air vents while curing the adhesive agent, which prevent the occurrence of voids in the adhesive agent in the air cavity packages, thereby the yield of the air cavity packages is improved.

3. Because of the reduction of the occurrence of voids in the adhesive agent in the air cavity packages, the amount of adhesive agent applied in the structures and methods for air cavity packaging provided by the present invention can be reduced, which prevent the electrical degradation of the dies cause by the dripping of excess adhesive agent, thereby the yield rate of the air cavity packages is improved.

4. According to a method for air cavity packaging provided by the present invention, after the processes of disposing the walls with air vents on the carrier, attaching the lid on the walls by using the adhesive agent, and curing the adhesive agent, the package structure thus formed can then be diced into plural air cavity packages. Or according to another method for air cavity packaging provided by the present invention, the lid with air vents is simply formed and attached on the carrier by applying the adhesive agent, the package structure thus formed can then be diced into plural air cavity packages. The packages produced by both of the above methods require no further grinding. The packaging processes is more simplified comparing with the previous air cavity packaging techniques, thereby the cost of production can reduced.

To sum up, the present invention can indeed get its anticipated object to provide a structure for air cavity packaging including plural connected air cavity packages with air vents disposed between every two adjacent packages, so that the air pressure inside the air cavities can be released to the outside through the air vents while curing the adhesive agent, which leads to the reduction of the occurrence of voids. Plural packages can thus be produced in one packaging run, and therefore the production rate and yield can be improved.

The description referred to the drawings stated above is only for the preferred embodiments of the present invention. Many equivalent local variations and modifications can still be made by those skilled at the field related with the present invention and do not depart from the spirits of the present invention, so they should be regarded to fall into the scope defined by the appended claims.

What is claimed is:

1. A structure for air cavity packaging, comprising:
   a carrier comprising plural die pads and plural leads;
   plural dies each mounted on a die pad;
   plural wires electrically connecting the plural dies to the plural leads;
   plural walls disposed on the carrier and forming plural cavities in a way that each cavity contains at least one die pad and plural leads, and each wall provided with at least one air vent for exhausting air to the outside; and
   a lid attached on the plural walls by means of an adhesive agent for sealing the plural cavities to plural sealed air cavities.

2. The structure for air cavity packaging according to claim 1, wherein the carrier is made of metal or ceramic materials.

3. The structure for air cavity packaging according to claim 1, wherein the adhesive agent is epoxy, UV glue, or tin-gold.

4. The structure for air cavity packaging according to claim 1, wherein the plural walls are made of polymers, metal, or ceramic materials.

5. The structure for air cavity packaging according to claim 1, wherein the lid is made of polymers, metal, glasses, or ceramic materials.

6. A structure for air cavity packaging, comprising:
   a carrier comprising plural die pads and plural leads;
   plural dies each mounted on a die pad;
   plural wires electrically connecting the plural dies to the plural leads;
   a lid having plural cavities on the underside thereof, wherein at least one air vent for exhausting air to the outside is provided between every two adjacent cavities, the lid is attached on the carrier in a way that each cavity covers at least one die pad and plural leads, and the lid is sealed to the carrier by means of an adhesive agent and forming plural sealed air cavities.

7. The structure for air cavity packaging according to claim 6, wherein the carrier is made of metal or ceramic materials.

8. The structure for air cavity packaging according to claim 6, wherein the adhesive agent is epoxy, UV glue, or tin-gold.

9. The structure for air cavity packaging according to claim 4, wherein the lid is made of polymers, metal, glasses, or ceramic materials.

10. A method for air cavity packaging, comprising:
    A1. providing a carrier comprising plural die pads and plural leads;
    A2. disposing plural walls on the carrier and forming plural cavities in a way that each cavity contains at least one die pad and plural leads, and each wall provided with at least one air vent for exhausting air to the outside;
    A3. providing plural dies each mounted on a die pad;
    A4. providing plural wires electrically connecting the plural dies to the plural leads;
    A5. providing a lid, applying an adhesive agent to the top of the plural walls or the underside of the lid, covering the lid onto the plural walls, and curing the adhesive agent to attach the lid on the top of the plural walls so that the plural cavities are sealed and an air cavity package structure having plural sealed air cavities are formed; and
    A6. dicing the air cavity package structure having plural sealed air cavities into plural air cavity packages.

11. The method for air cavity packaging according to claim 10, wherein in step A5, the adhesive agent is cured by heating.

12. The method for air cavity packaging according to claim 11, wherein the adhesive agent is epoxy, UV glue, or tin-gold.

13. A method for an air cavity packaging, comprising:
    B1. providing a carrier comprising plural die pads and plural leads, and providing plural dies each mounted on a die pad;
    B2. providing plural wires electrically connecting the plural dies to the plural leads;
    B3. providing a lid having plural cavities on the underside thereof, and providing at least one air vent for exhausting air to the outside between every two adjacent cavities;
    B4. applying an adhesive agent to the top of the carrier or the underside of the lid, covering the lid onto the carrier in a way that each of the cavities covers at least one die pad and plural leads, and curing the adhesive agent to attach the lid on the carrier so that the plural cavities are sealed and an air cavity package structure having plural sealed air cavities are formed; and
    B5. dicing the air cavity package structure having plural sealed air cavities into plural air cavity packages.

14. The method for air cavity packaging according to claim 13, wherein in step B4, the adhesive agent is cured by heating.

15. The method for air cavity packaging according to claim 14, wherein the adhesive agent is epoxy, UV glue, or tin-gold.

* * * * *